(12) United States Patent
Lin

(10) Patent No.: US 7,221,027 B2
(45) Date of Patent: May 22, 2007

(54) LATCHUP PREVENTION METHOD FOR INTEGRATED CIRCUITS AND DEVICE USING THE SAME

(75) Inventor: I-Cheng Lin, Taipei (TW)

(73) Assignee: Winbond Electronics Corporation, Hsinchu (TW)

( * ) Notice: Subject to any disclaimer, the term of this patent is extended or adjusted under 35 U.S.C. 154(b) by 436 days.

(21) Appl. No.: 10/847,317

(22) Filed: May 18, 2004

(65) Prior Publication Data

US 2005/0259372 A1 Nov. 24, 2005

(51) Int. Cl.
*H02H 9/00* (2006.01)
(52) U.S. Cl. ........................................ 257/355; 257/360
(58) Field of Classification Search ................ 257/355, 257/360, 362; 361/56
See application file for complete search history.

(56) References Cited

U.S. PATENT DOCUMENTS

| 5,237,395 A | * | 8/1993 | Lee | ............................ 257/358 |
| 5,287,241 A | * | 2/1994 | Puar | ............................ 361/56 |
| 5,942,932 A | | 8/1999 | Shen | |
| 5,959,820 A | * | 9/1999 | Ker et al. | .................... 361/111 |
| 6,309,940 B1 | | 10/2001 | Lee | |

FOREIGN PATENT DOCUMENTS

| KR | 2000-0045936 | 7/2000 |
| KR | 2002-0045016 | 6/2002 |

* cited by examiner

*Primary Examiner*—Vu A. Le
(74) *Attorney, Agent, or Firm*—Birch, Stewart, Kolasch & Birch, LLP

(57) ABSTRACT

An integrated circuit preventing latchup. In the integrated circuit, an internal circuit is disposed in a substrate and has a parasitic SCR structure. At least one ESD protection circuit and active area are disposed on the substrate and coupled to a pad. A first current shunting diode has an anode coupled to the pad and a cathode coupled to a first voltage source. A second current shunting diode has a cathode coupled to the pad and an anode coupled to a second voltage source. Minority-carriers guard rings surround the first current shunting diode and the second shunting diode. Distance between the first and second current shunting diodes and the internal circuit, the active area and the ESD protection circuit exceed 80 μm.

9 Claims, 2 Drawing Sheets

LATCHUP PREVENTION METHOD FOR INTEGRATED CIRCUITS AND DEVICE USING THE SAME

BACKGROUND OF THE INVENTION

1. Field of the Invention

The present invention relates to integrated circuits, and more particularly, to a latchup prevention method for integrated circuits, and device using the same.

2. Description of the Related Art

Latchup effect is an important reliability issue in CMOS integrated circuit (IC), in which low impedance paths are formed by activation of a parasitic PNPN SCR (silicon controlled rectifier). Since the power supply has a low shunt impedance to ground during latchup, a large current occurs between the power supply and the ground. This results in logic errors or malfunctions of circuits, or even irreversible damage to the IC. Unfortunately, because the P+ region of PMOS and N-well, P-sub and N+ regions of NMOS in integrated circuitry form a PNPN SCR structure, the parasitic SCR is inherent in CMOS process.

There are many origins and causes of latchup in CMOS. However, the most prominent is substrate current produced by hot carrier effect and/or forward biasing of parasitic diodes by noise appear on the pad during chip operation. Most substrate current (Isub) that results in latchup is injected from parasitic diodes formed by ESD protection circuits, as shown in FIG. 1. Activation of the parasitic SCR is triggered by the parasitic PNP transistor (P+/N-well/P-sub) and the parasitic NPN transistor (N-well/P-sub/N+). Further, the two transistors are activated if the base-emitter voltage (Vbe) across the base-emitter junction exceeds 0.7V. This voltage builds up according to the IR drop on the well/substrate resistor, such that well/substrate resistance or bipolar gain of parasitic transistors must be reduced in order to prevent latchup.

Conventional solutions for latchup and drawbacks thereof follow.

First, latchup can be prevented by process technique. Epitaxial CMOS can provide well/substrate resistance, and trench isolation and silicon on insulator (SOI) can minimize coupling between parasitic PNP and NPN transistors. Thus, epitaxial CMOS, trench isolation and silicon on insulator (SOI) can provide latchup prevention. However, this increases process complexity and fabrication costs.

Further, latchup can also be prevented during layout. Majority and minority-carrier guard rings are thereby commonly used, decoupling parasitic bipolar transistors and collecting injected carriers before latchup in CMOS internal circuit is induced by the injected carriers. Well/substrate resistance is reduced by increasing pickup contact in well and substrate and/or by reducing distance between the device diffusion area and pickup contacts, thereby increasing latchup resistance. However, such solution requires large layout area and increases chip size, with utilization limited by specific layout restrictions. While an alternative is to increase the distance between the I/O injector and internal circuit, this increases total chip size dramatically and is frequently limited in use.

Moreover, latchup can also be prevented with circuit techniques. A latchup detection circuit is disclosed by Shen et al. in U.S. Pat. No. 5,942,932, in which changes in well/substrate voltage potential are detected and activate the circuit during latchup to pull back the well/substrate voltage potential to the original value thereof. This, however, also increases circuit complexity and layout space requirements.

Therefore, there is a need for a method to avoid latchup in integrated circuits under conditions in which restricted layout area precludes deployment of guard rings and well/substrate pickup contacts near the internal circuits.

SUMMARY OF THE INVENTION

It is therefore an object of the present invention to minimize the influence of latchup trigger sources, thereby avoiding latchup.

According to the above mentioned object, the present invention provides an integrated circuit capable of avoiding latchup. In the integrated circuit, an internal circuit is disposed on a substrate, includes at least one parasitic SCR structure. At least one ESD protection circuit is disposed on the substrate and coupled to a pad. At least one active area is disposed on the substrate and coupled to the pad. At least one first current shunting diode has an anode coupled to the pad and a cathode coupled to a first voltage source. At least one second current shunting diode has a cathode coupled to the pad and an anode coupled to a second voltage source. Minority-carrier guard rings (n+ guard ring surrounding n+/P-sub diode and p+ guard ring surrounding p+/n-well diode) surround the first current shunting diode and the second current shunting diode. Distances between the first and second current shunting diodes and the internal circuit, the active area and the ESD protection circuit all exceed 80 μm. The current shunting diode serves as an extra current shunting path when undesired noise current occurs on the pad.

According to the above mentioned object, the present invention also provides latchup prevention method for internal circuits. In this method, at least one current shunting diode is provided on a substrate with an internal circuit, at least one active area, and at least one ESD protection device coupled to a pad. The internal circuit includes at least one parasitic SCR structure. Further, distances between the current shunting diode and the internal circuit and between the ESD protection device and the active area coupled to the pad are all exceed 80 μm. The current shunting diode provides an additional current shunting path when undesired noise current occurs on the pad.

BRIEF DESCRIPTION OF THE DRAWINGS

The present invention can be more fully understood by the subsequent detailed description and examples with reference made to the accompanying drawings, wherein.

DETAILED DESCRIPTION OF THE INVENTION

The present invention minimizes the influence of latchup trigger source, unlike conventional methods that prevent the occurrence of latchup in a passive way. In the present invention, current shunting diodes act as additional paths for substrate current to minimize the influence of latchup trigger source without modifying the original layout of the internal circuit and the ESD protection circuit, thereby avoiding of latchup.

The latchup prevention method of the present invention is described as follows with reference to FIG. 2.

Figure 1:
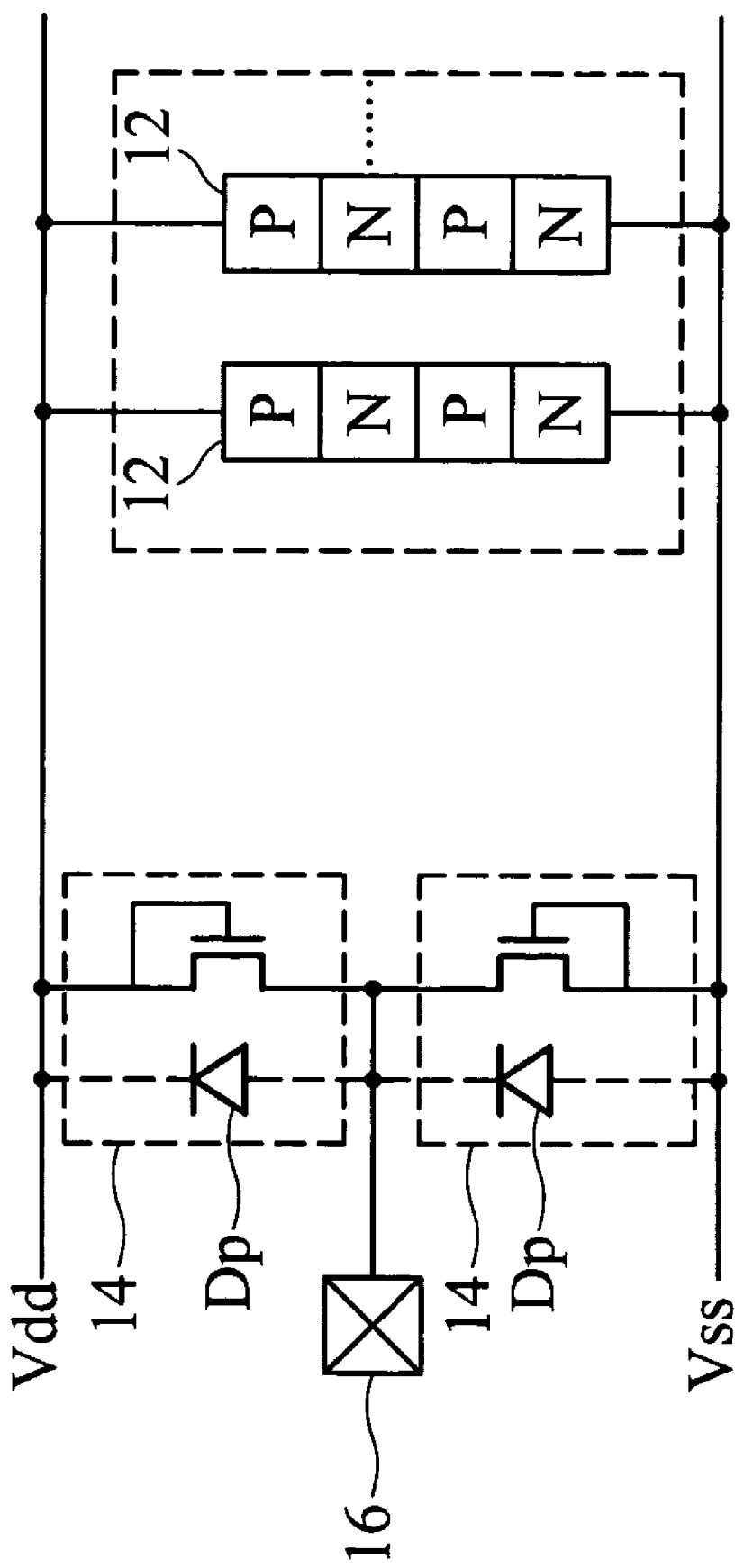
FIG. 1 is a diagram of a conventional integrated circuit.
Figure 2:
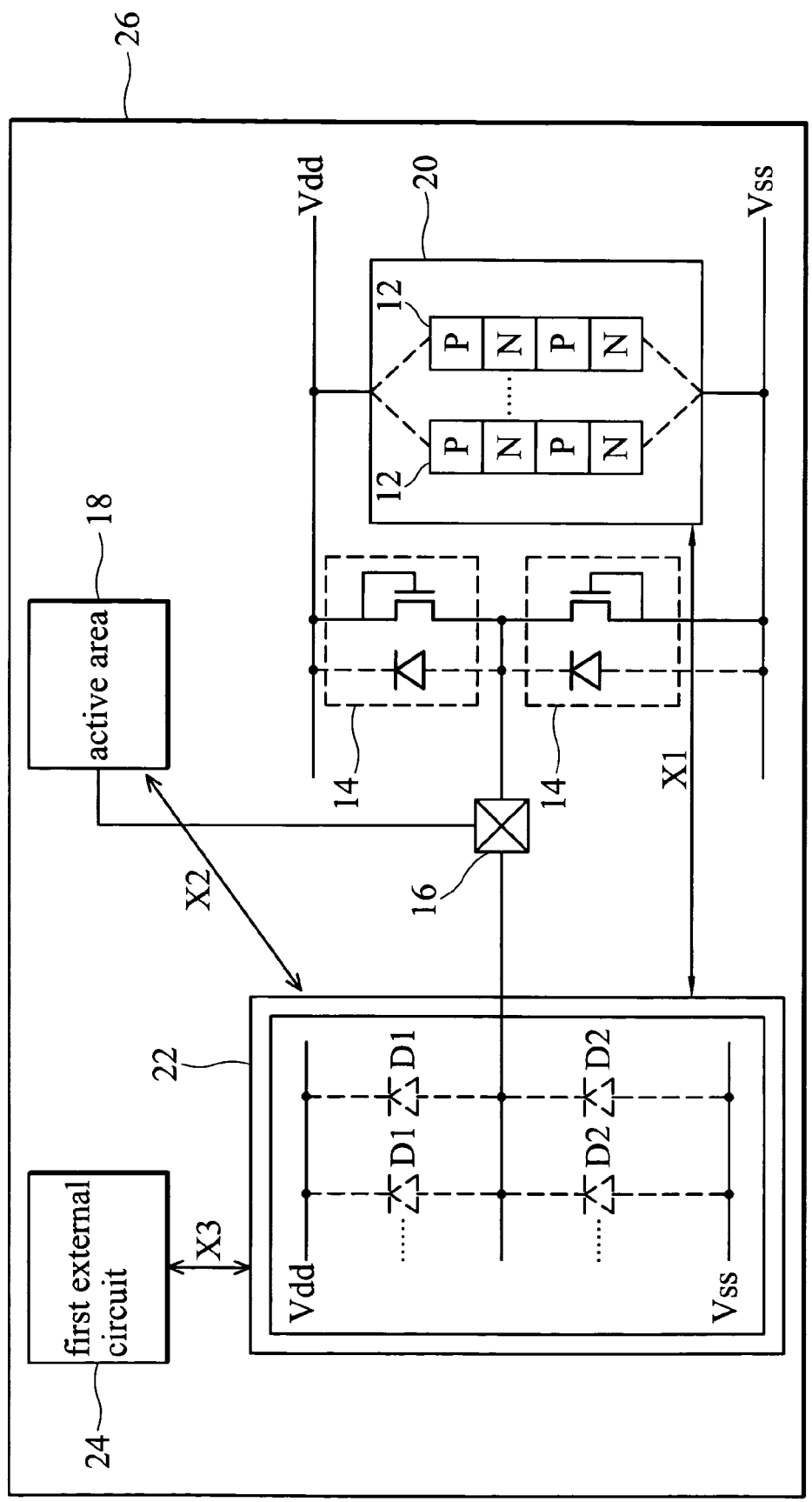
FIG. 2 is a diagram of an integrated circuit providing reduced latchup hazard according to the present invention.

In the present invention, current shunting diodes (D1 and D2) are disposed on the substrate including an internal circuit 20, an active area 18, the first external circuit 24 and an ESD protection device 14, as shown in FIG. 2. The internal circuit 20 includes at least one parasitic SCR structure 12, and the active area 18 and the ESD protection device 14 coupled to the pad 16. Distance between the current shunting diodes (D1 and D2) and the internal circuit 20, between the current shunting diodes (D1 and D2) and active area 18, and distance between the current shunting diodes (D1 and D2) and the ESD protection device 14 all exceed 80 µm. When undesired noise current occurs on the pad 16, the current shunting diodes (D1 and D2) act as additional current shunting paths, effectively reducing substrate current injected by ESD protection device 14. Thus, latchup occurred at the parasitic SCR structure 12 in the internal circuit 20 is avoided.

In the present invention, "trigger level" is defined as the maximum current level injected from the pad 16 to the internal circuit 20 before latchup. Further, according to Kirchhoff's current law (KCL), when the current shunting diodes (D1 and D2) are disposed on the integrated circuit and coupled to the pad 16, the total injected current is shared by ESD protection circuit 14 and the current shunting diodes (D1 and D2). Thus, substrate current injected by ESD protection device 14 is reduced effectively by the current shunting diodes (D1 and D2). Namely, the trigger level for latchup is increased with the number of current shunting diodes, increasing latchup trigger level and decreasing latchup occurrence.

Further, in the present invention, current shunting diodes (D1 and D2) can be disposed at a distance from pad 16 in any location where available layout space allows. Thus, the trigger level for latchup can be increased, decreasing latchup occurrence.

In the present invention, current shunting diodes (D1 and D2) are not activated during normal operation, but are activated upon noise or increased voltage on the pad 16. For example, the current shunting diodes (D1 and D2) can be low voltage diodes, high voltage diodes with double diffusion drain (DDD) structure to increase breakdown voltage, or parasitic diodes formed by additional ESD protection devices such as NMOS transistor or PMOS transistor with grounded gates, floating gates or gates connected to RC network. The distance between the current shunting diodes (D1 and D2) and the first external circuit 24 disposed on the substrate and not coupled to the pad 16 exceeds 40 µm to avoid latchup event enabled by parasitic SCR activation at the first external circuit near the current shunting diodes (D1 and D2).

Moreover, minority-carriers guard rings 22 can also be disposed to surround the current shunting diodes D1 and D2 in the present invention, by which carriers injected from the current shunting diodes (D1 and D2) can be collected and removed before triggering parasitic SCR in the vicinity, inducing latchup. In this case, the distance between the current shunting diodes (D1 and D2) and the first external circuit 24 disposed on the substrate and not coupled to the pad 16 at least exceeds 30 µm to avoid latchup event enabled by parasitic SCR activation at the first external circuit near the current shunting diodes (D1 and D2).

FIG. 2 shows an integrated circuit providing reduced latchup occurrence. In the integrated circuit, an internal circuit 20 is disposed in a substrate 26, including at least one parasitic SCR structure. ESD protection circuit 14 and active area 18 are disposed on the substrate 26 and coupled to a pad 16. First current shunting diode D1 has an anode coupled to the pad 16 and a cathode coupled to a first voltage source Vdd. Second current shunting diode D2 has a cathode coupled to the pad 16 and an anode coupled to a second voltage source Vss. Distance between the current shunting diodes (D1 and D2) and the internal circuit 20, between the current shunting diodes (D1 and D2) and active area 18, and distance between the current shunting diodes (D1 and D2) and ESD protection device 14 exceed 80 µm. Minority-carrier guard rings 22 surround the first current shunting diode D1 and the second current shunting diode D2 to collect and remove the carriers injected by the first and second current shunting diodes D1 and D2 before injected carriers trigger parasitic SCR structure in the first external circuit 24 inducing latchup. For example, the current shunting diodes (D1 and D2) can be low voltage diodes, high voltage diodes with double diffusion drain (DDD) structure to increase breakdown voltage, or parasitic diodes formed by additional ESD protection device, such as NMOS transistor or PMOS transistor with grounded gates, floating gates or gates connected to RC network. The distance between the current shunting diodes (D1 and D2) and the first external circuit 24 disposed on the substrate and not coupled to the pad 16 exceeds at least 30 µm to avoid latchup triggered by parasitic SCR in the first external circuit near the current shunting diodes (D1 and D2).

According to Kirchhoff's current law (KCL), due to the current shunting diodes (D1 and D2), the total injected current on the pad 16 is shared by ESD protection circuit 14 and the current shunting diodes (D1 and D2). Thus, the substrate current injected by ESD protection device 14 is reduced effectively by the current shunting diodes (D1 and D2). The trigger level for latchup is increased with the number of current shunting diodes. Thus, in the present invention, trigger level of latchup is increased, and latchup occurrence is reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit providing reduced latchup occurrence, comprising:
    an internal circuit disposed in a substrate, comprising at least one parasitic SCR structure;
    at least one active area disposed on the substrate and coupled to a pad; and
    at least one current shunting diode coupled to the pad, wherein distances between the current shunting diode and the internal circuit and between the current shunting diode and the active area coupled to the pad exceed 80 µm, and the current shunting diode acts as an extra current shunting path when undesired noise current occurs on the pad.

2. The integrated circuit as claimed in claim 1, further comprising a first external circuit disposed on the substrate and not coupled to the pad, wherein distance between the external circuit and the current shunting diode exceeds 40 µm.

3. The integrated circuit as claimed in claim 1, further comprising a guard ring surrounding the current shunting diode.

4. The integrated circuit as claimed in claim 3, further comprising a first external circuit disposed on the substrate and not coupled to the pad, wherein distance between the external circuit and the current shunting diode exceeds 30 µm.

5. The integrated circuit as claimed in claim 1, wherein the current shunting diode comprises a diode with double diffused drain (DDD) structure.

6. The integrated circuit as claimed in claim 1, wherein the current shunting diode comprises a parasitic diode.

7. An integrated circuit providing reduced latchup occurrence, comprising:
- an internal circuit disposed in a substrate, comprising at least a parasitic SCR structure;
- at least one ESD protection circuit disposed on the substrate and coupled to a pad;
- at least one active area disposed on the substrate and coupled to the pad;
- at least one first current shunting diode having an anode coupled to the pad and a cathode coupled to a first voltage source;
- at least one second current shunting diode having a cathode coupled to the pad and an anode coupled to a second voltage source; and
- minority-carrier guard rings surrounding the first current shunting diode and the second shunting diode;
- wherein distance between the first and second current shunting diodes and the internal circuit, the active area and the ESD protection circuit exceed 80 µm.

8. The integrated circuit as claimed in claim 7, further comprising a first external circuit on the substrate and not coupled to the pad, wherein distance between the external circuit and the current shunting diode exceeds 30 µm.

9. The integrated circuit as claimed in claim 6, the first current shunting diode and second current shunting diode are diodes with double diffused drain (DDD) structure.

* * * * *